(12) United States Patent
Wang et al.

(10) Patent No.: US 8,766,838 B2
(45) Date of Patent: Jul. 1, 2014

(54) METHOD AND APPARATUS FOR PERFORMING MODULATION OF A RADIO FREQUENCY SIGNAL

(71) Applicant: MediaTek Singapore Pte. Ltd., Singapore (SG)

(72) Inventors: Hua Wang, San Francisco, CA (US); Paul Cheng Po Liang, Hsinchu County (TW)

(73) Assignee: MediaTek Singapore Pte. Ltd., Solaris, Singapore (SG)

( * ) Notice: Subject to any disclaimer, the term of this patent is extended or adjusted under 35 U.S.C. 154(b) by 0 days.

(21) Appl. No.: 13/798,197

(22) Filed: Mar. 13, 2013

(65) Prior Publication Data

US 2014/0015701 A1 Jan. 16, 2014

Related U.S. Application Data

(60) Provisional application No. 61/672,080, filed on Jul. 16, 2012.

(51) Int. Cl.
*H03M 1/66* (2006.01)
(52) U.S. Cl.
CPC ...................................... *H03M 1/66* (2013.01)
USPC .......................................... 341/144; 375/353
(58) Field of Classification Search
CPC .............................. H03M 1/66; H03M 1/0614
USPC .................................. 341/144; 375/376, 353
See application file for complete search history.

(56) References Cited

U.S. PATENT DOCUMENTS

| 7,046,098 | B2 | 5/2006 | Staszewski |
| 7,209,936 | B2 | 4/2007 | Sullivan |
| 7,463,775 | B1 * | 12/2008 | Sites ............................ 382/232 |
| 7,483,508 | B2 | 1/2009 | Staszewski |
| 7,590,991 | B2 * | 9/2009 | Arad et al. ...................... 725/15 |
| 7,817,747 | B2 | 10/2010 | Waheed |
| 8,000,428 | B2 | 8/2011 | Staszewski |
| 8,565,345 | B2 * | 10/2013 | Gupta ........................... 375/299 |
| 2007/0189431 | A1 | 8/2007 | Waheed |
| 2011/0261871 | A1 | 10/2011 | Staszewski |

OTHER PUBLICATIONS

Wang et al., Title: RF Transmitter, Integrated Circuit Device, Wireless Communication Unit and Method Therefor, pending U.S. Appl. No. 13/298,282, filed Nov. 16, 2011.
Wang et al., Title: RF Transmitter, Integrated Circuit Device, Wireless Communication Unit and Method Therefor, pending U.S. Appl. No. 13/351,209, filed Jan. 16, 2012.

\* cited by examiner

*Primary Examiner* — Peguy Jean Pierre
(74) *Attorney, Agent, or Firm* — Winston Hsu; Scott Margo

(57) ABSTRACT

A method and apparatus for performing modulation of a radio frequency, RF, signal within a digital-to-RF converter. The method includes determining a desired digital control word switching frequency value based at least partly on at least one parameter corresponding to a bandwidth of the RF signal to be modulated and at least one from a group including: at least one parameter corresponding to an RF channel frequency of the RF signal to be modulated; and at least one parameter corresponding to a power level of the RF signal to be modulated. The method further includes dynamically configuring at least one digital control module to output at least one digital control word signal in accordance with the desired digital control word switching frequency value, and performing modulation of the RF signal in accordance with the at least one digital control word signal output by the at least one digital control module.

20 Claims, 8 Drawing Sheets

METHOD AND APPARATUS FOR PERFORMING MODULATION OF A RADIO FREQUENCY SIGNAL

CROSS REFERENCE TO RELATED APPLICATIONS

This application claims the benefit of U.S. provisional application No. 61/672,080, filed on Jul. 16, 2012 and incorporated herein by reference.

BACKGROUND

The field of this invention relates to a method and apparatus for performing modulation of a radio frequency (RF) signal, and in particular to a method and apparatus for performing modulation of a radio frequency signal within a digital-to-RF converter.

The rapid advances in deep sub-micron CMOS (Complementary Metal-Oxide-Semiconductor) processes have led to digital-to-RF transmitter architectures that are becoming increasingly more popular due to their high efficiency. However, a key issue with the use of such digital-to-RF transmitter architectures is that the digital code-words used to control any analogue block within the digital-to-RF transmitter architecture introduce so-called DAC (Digital to Analogue Converter) images at the clock frequency of the digital code-word logic, and at harmonics thereof. Such DAC images may violate regulatory requirements, such as FCC (Federal Communications Commission) requirements, as well as certain in-device co-existence requirements such as PSD (Power Spectral Density) requirements, etc.

Such DAC images may be suppressed byway of a sinc function applied to the DAC sample-and-hold to 'notch out' the DAC images. However, the use of a sinc function is only good for narrow band systems, and is not appropriate for wide-bandwidth systems.

A more conventional approach to suppressing the DAC images is by way of additional analogue band-pass filtering, whereby the DAC images are attenuated by an analogue filter at the output of the digital-to-RF transmitter. However, such RF filtering incurs extra cost for the end device, and introduces pass-band loss into the transmit path. Such RF filters are particularly costly to implement for wide-bandwidth systems.

Thus, there is a need for an efficient and cost effective solution to the problem of DAC images within digital-to-RF transmitter architectures.

SUMMARY

Accordingly, the invention seeks to mitigate, alleviate or eliminate one or more of the above mentioned disadvantages singly or in any combination. Aspects of the invention provide a method for generating a radio frequency signal for transmission over a radio frequency interface.

According to a first aspect of the invention, there is provided a method of performing modulation of a radio frequency (RF) signal within a digital-to-RF converter. The method comprises determining a desired digital control word switching frequency value based at least partly on at least one parameter corresponding to a bandwidth of the RF signal to be modulated and at least one from a group comprising: at least one parameter corresponding to an RF channel frequency of the RF signal to be modulated; and at least one parameter corresponding to a power level of the RF signal to be modulated. The method further comprises dynamically configuring at least one digital control module to output at least one digital control word signal in accordance with the desired digital control word switching frequency value, and performing modulation of the RF signal in accordance with the at least one digital control word signal output by the at least one digital control module.

In this manner, by dynamically configuring the digital control module(s) to output digital control word signal(s) in accordance with the desired digital control word switching frequency value, which is not only based on a bandwidth of the RF signal to be modulated but additionally based on at least one parameter corresponding to an RF channel frequency of the RF signal to be modulated; and at least one parameter corresponding to a power level of the RF signal to be modulated, the switching frequency of the digital control word signal(s) may be configured in order to, for example, reduce DAC images introduced thereby within application sensitive frequency bands, and/or induced outside of such application sensitive frequency bands. This is achievable since the frequencies at which DAC images occur are related substantially directly to the switching frequency of the digital control word signal(s). Advantageously, by manipulation of DAC images in this manner, it enables regulatory and in-device requirements to be met without the need for such DAC images to subsequently be suppressed, for example by way of additional analogue band-pass filtering that may be substantially alleviated, providing an efficient, low cost solution that is suitable for wide-bandwidth applications.

In one optional embodiment of the invention, the method may comprise dynamically configuring a clock signal for the at least one digital control module based at least partly on the desired digital control word switching frequency value.

In one optional embodiment of the invention, the determining of a desired digital control word switching frequency value may be performed based on at least one parameter corresponding to each of a bandwidth of the RF signal to be modulated, an RF channel frequency of the RF signal to be modulated; and a power level of the RF signal to be modulated. For example, the method may comprise retrieving a desired digital control word switching frequency value from at least one lookup table in accordance with the received at least one parameter. Alternatively, the method may comprise deriving a desired digital control word switching frequency value by applying the received at least on parameter to a digital control word switching frequency decision algorithm.

In one optional embodiment of the invention, the method may comprise based on at least two substantially simultaneous parameters corresponding to a bandwidth of the RF signal to be modulated, an RF channel frequency of the RF signal to be modulated; and a power level of the RF signal to be modulated.

In one optional embodiment of the invention, the method may comprise performing modulation of the RF signal within a digital-to-RF converter within one of: a complex digital-to-RF transmitter; a digital polar transmitter; a hybrid polar transmitter; and a LINC transmitter.

In one optional embodiment of the invention, the method may comprise determining a desired digital control word switching frequency value to reduce digital to analogue conversion images within application sensitive frequency bands.

In one optional embodiment of the invention, the method may comprise determining a desired digital control word switching frequency value to induce digital to analogue conversion images outside of application sensitive frequency bands.

According to a second aspect of the invention, there is provided a digital-to-RF converter module for performing modulation of a radio frequency (RF) signal. The digital-to-RF module is arranged to determine a desired digital control word switching frequency value based at least partly on at least one parameter corresponding to a bandwidth of the RF signal to be modulated and at least one from a group comprising: at least one parameter corresponding to an RF channel frequency of the RF signal to be modulated; and at least one parameter corresponding to a power level of the RF signal to be modulated; dynamically configuring at least one digital control module to output at least one digital control word signal in accordance with the desired digital control word switching frequency value, and performing modulation of the RF signal in accordance with the at least one digital control word signal output by the at least one digital control module.

In one optional embodiment of the present invention, the digital-to-RF converter module may be implemented within an integrated circuit device comprising at least one die within a single integrated circuit package.

According to a third aspect of the invention, there is provided a radio frequency transmitter (RF) comprising the digital-to-RF converter module or the second aspect of the invention.

These and other aspects of the invention will be apparent from, and elucidated with reference to, the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

The present invention will now be described with reference to some example embodiments of the present invention as illustrated in the accompanying drawings. However, it will be appreciated that the present invention is not limited to the specific examples described herein. Furthermore, because the illustrated embodiments of the present invention may for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

Figure 1:
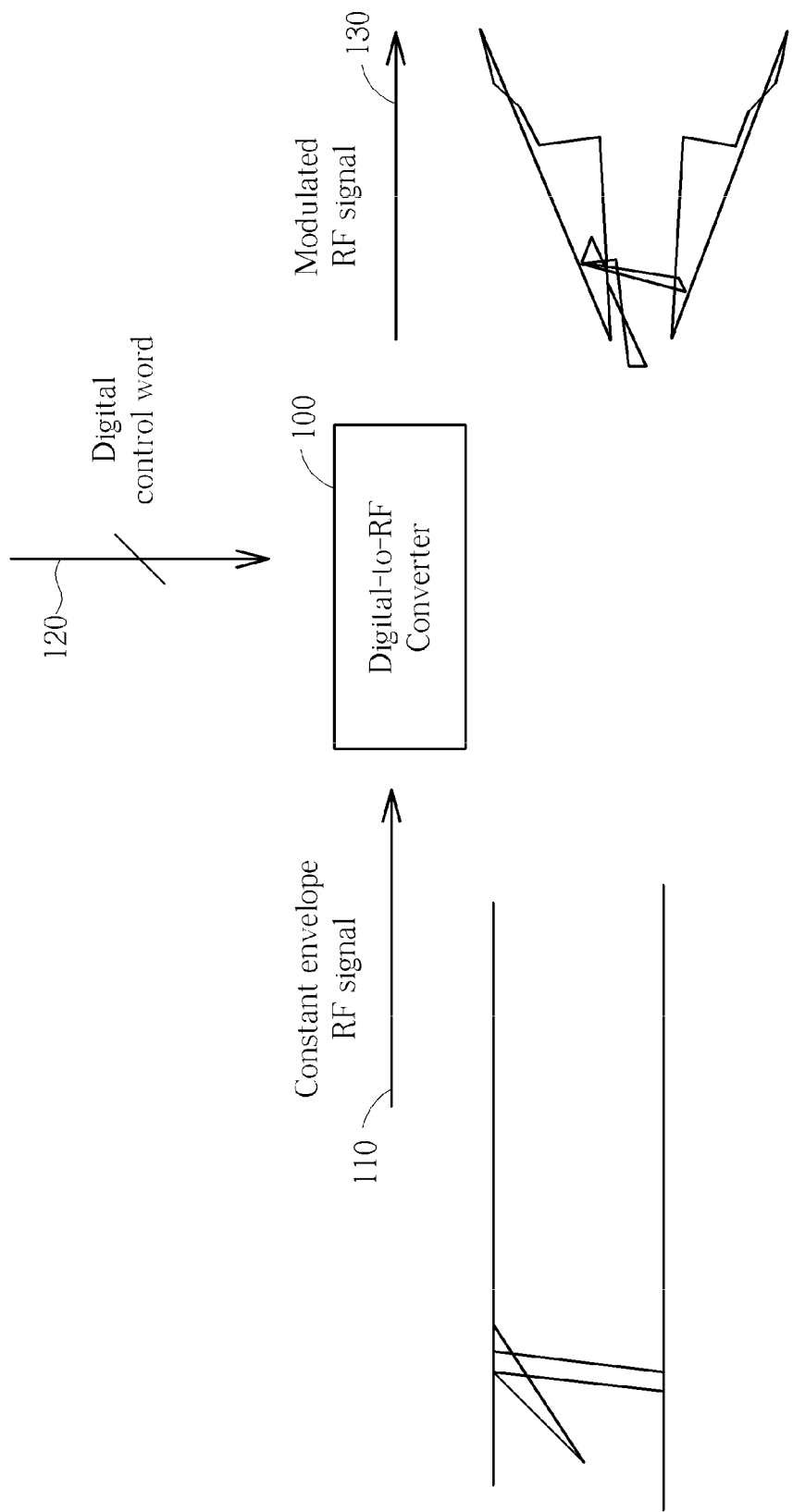
FIG. 1 illustrates a simplified block diagram of an example of a digital-to-RF converter.

Referring first to FIG. 1, there is illustrated a simplified block diagram of an example of a digital-to-RF converter 100 for performing modulation of a radio frequency, RF, signal. The digital-to-RF converter 100 is arranged to receive an RF signal, which in the illustrated example comprises a constant envelope RF signal 110, perform modulation of the received RF signal 110 in accordance with a received digital control word signal 120, and to output a modulated RF signal 130 accordingly.

Figure 2:
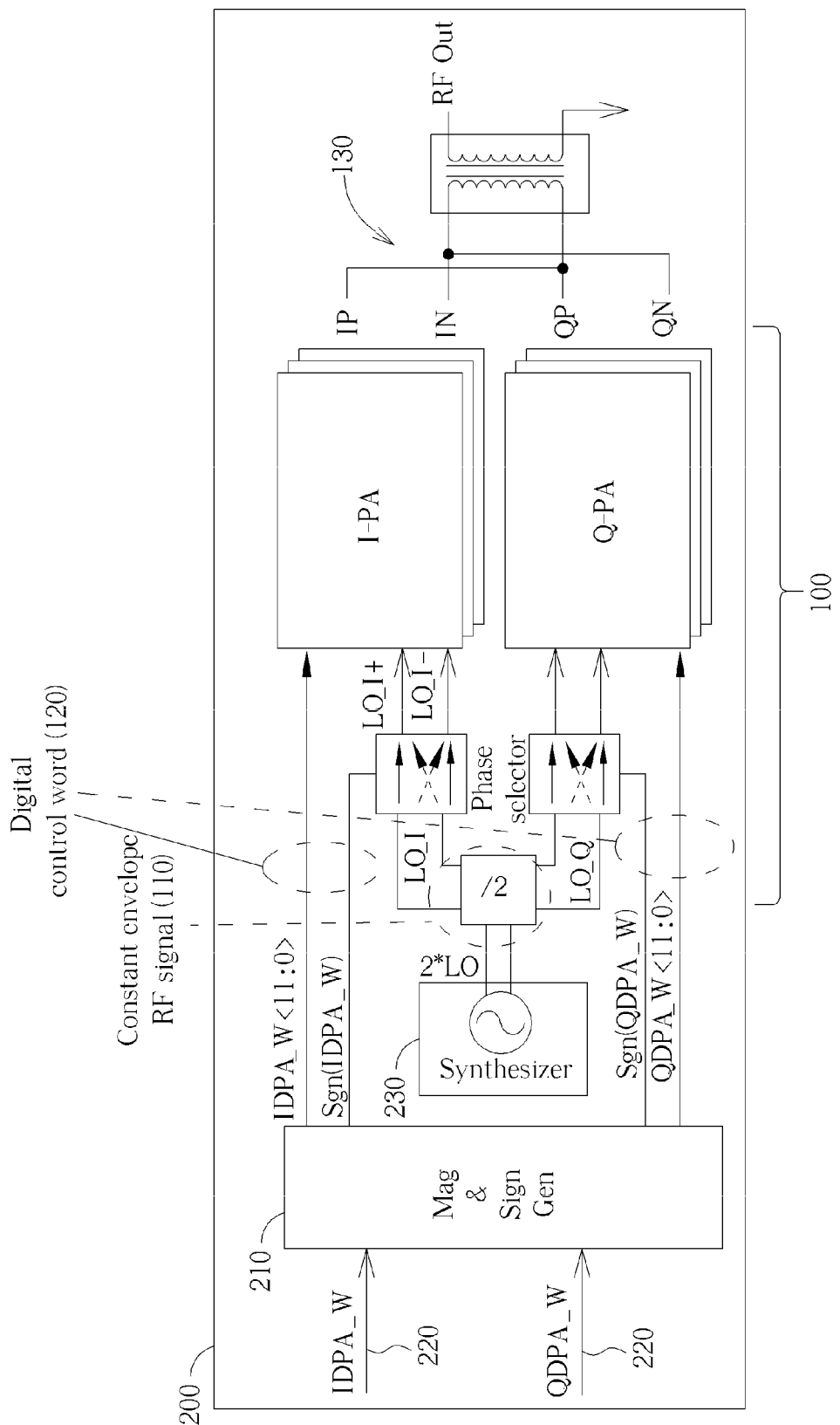
FIG. 2 illustrates a simplified block diagram of a first example of a digital-to-RF transmitter architecture.

In some example embodiments, such a digital-to-RF converter 100 may form part of a digital-to-RF transmitter, such as the digital-to-RF transmitter 200 illustrated in FIG. 2. A digital-to-RF transmitter of the type illustrated in FIG. 2 is described in the applicant's co-pending application U.S. application Ser. No. 13/298,282, filed on 2011 Nov. 16 and a corresponding provisional U.S. application 61/477,684, filed on 2011 Apr. 21. However, in brief, the digital-to-RF transmitter 200 illustrated in FIG. 2 comprises a complex (in-phase/quadrature) transmitter comprising digital control logic (also denoted as "Mag & Sign Gen") 210 arranged to receive a digital modulation signal 220, which in the illustrated example comprises an in-phase modulation component IDPA_W and a quadrature modulation component QDPA_W. The digital control logic 210 is arranged to output a digital control word signal 120 to the digital-to-RF converter component 100 of the digital-to-RF transmitter 200, which in the illustrated example comprises an in-phase control word signal IDPA_W<11:0>, Sgn(IDPA_W) and a quadrature control word signal QDPA_W<11:0>, Sgn(QDPA_W). The digital-to-RF converter component 100 receives an RF signal to be modulated, which in the illustrated example comprises a constant envelope RF signal 110 generated by a synthesizer 230, and outputs a modulated RF signal 130.

As previously mentioned, a key issue with the use of such digital-to-RF converter architectures is that the digital codewords used to control any analogue block within the digital-to-RF converter architecture introduce so-called DAC (Digital to Analogue Converter) images at the clock frequency of the digital code-word logic, and at harmonics thereof. Accordingly, some example embodiments of the present invention propose a method of performing modulation of an RF signal within a digital-to-RF converter, whereby the method comprises determining a desired digital control word switching frequency value based at least partly on at least one parameter corresponding to a bandwidth of the RF signal to be modulated and at least one from a group comprising: at least one parameter corresponding to an RF channel frequency of the RF signal to be modulated; and at least one parameter corresponding to a power level of the RF signal to be modulated. The method further comprises dynamically configuring at least one digital control module to output at least one digital control word signal in accordance with the desired digital control word switching frequency value, and performing modulation of the RF signal in accordance with the at least one digital control word signal output by the at least one digital control module.

In this manner, by dynamically configuring the digital control module(s) to output digital control word signal(s) in accordance with the desired digital control word switching frequency value, which is not only based on a bandwidth of the RF signal to be modulated but additionally based on at least one parameter corresponding to an RF channel frequency of the RF signal to be modulated; and at least one parameter corresponding to a power level of the RF signal to be modulated, the switching frequency of the digital control word signal(s) may be configured in order to reduce DAC images introduced thereby within application sensitive frequency bands, and/or induced outside of such application sensitive frequency bands. This is achievable since the frequencies at which DAC images occur are related substantially directly to the switching frequency of the digital control word signal(s).

Application sensitive frequency bands may comprise, for example, frequency bands that are subject to regulatory restriction (e.g. FCC (Federal Communications Commission) restrictions). Additionally and/or alternatively, application sensitive frequency bands may comprise frequency bands that are subject to certain in-device co-existence requirements.

Figure 3:
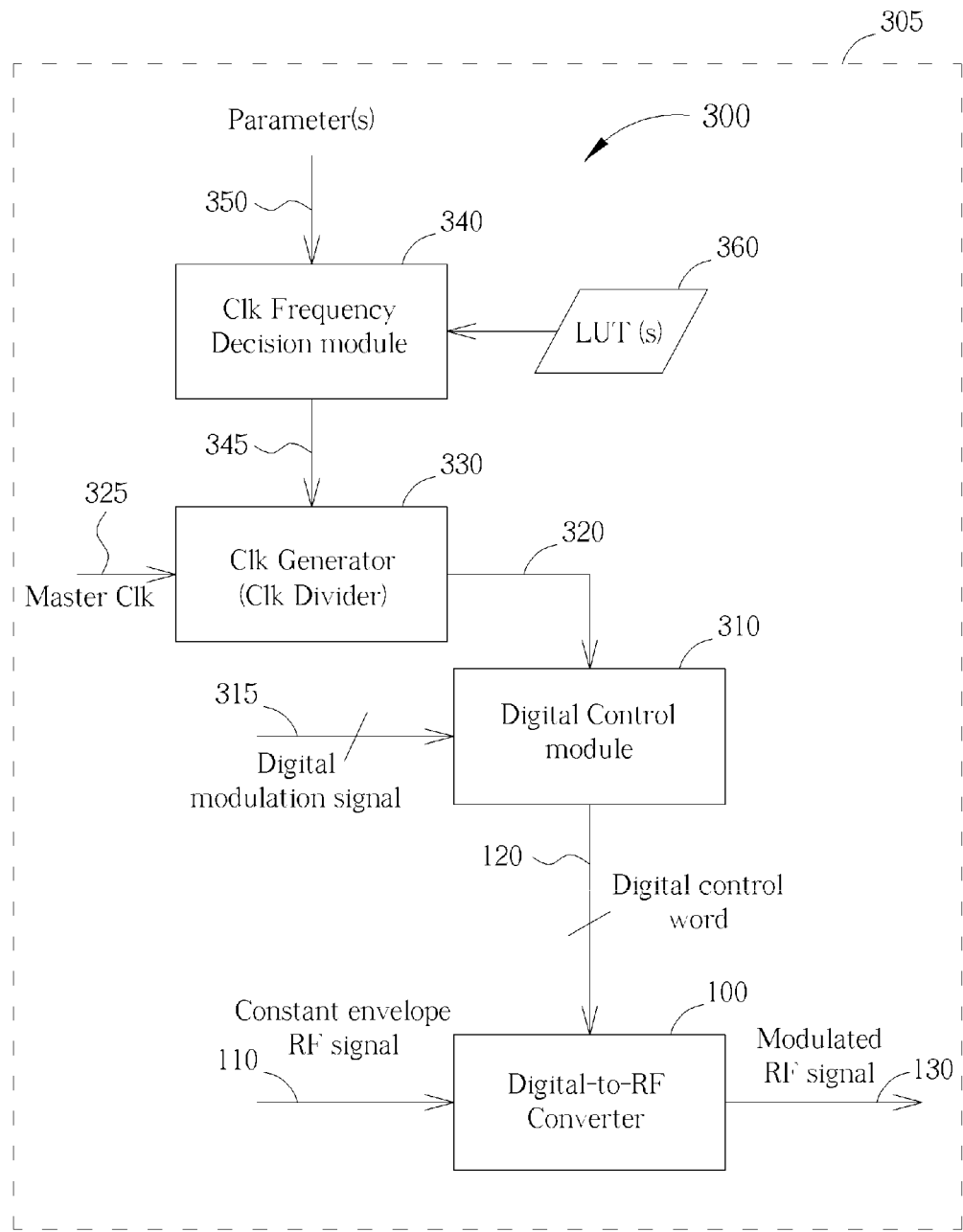
FIG. 3 illustrates a simplified block diagram of an example of a digital-to-RF converter module adapted in accordance with some example embodiments of the present invention.

FIG. 3 illustrates a simplified block diagram of an example of a digital-to-RF converter module 300 adapted in accordance with some example embodiments of the present invention. Such a digital-to RF converter module 300 may be implemented within an integrated circuit device comprising at least one or more dies within a single integrated circuit package, such as illustrated generally at 305. The digital-to RF converter module 300 comprises a digital-to-RF converter 100 arranged to receive an RF signal, which in the illustrated example comprises a constant envelope RF signal 110, perform modulation of the received constant envelope RF signal 110 in accordance with a received digital control word signal 120, and to output a modulated RF signal 130 accordingly.

The digital control word signal 120 is output by a digital control module 310, which in the illustrated example is arranged to receive a digital modulation signal 315, and to output the digital control word signal 120 in accordance with the received digital modulation signal 315. The digital control module 310 is further arranged to receive a clock signal 320 with which at least a part of the digital control module 310 is synchronised, and in particular with which the digital control word signal 120 output thereby is synchronised. For example, the digital control module 310 may be arranged to update the digital control word signal 120 upon each of a rising and/or falling edge of the received clock signal, or upon multiples and/or divisions thereof. In this manner, the switching frequency of the digital control word signal 120 is related to, and thus controllable by way of, the frequency of the clock signal 320.

The clock signal 320 received by the digital control module 310 is provided by a clock generator component (also denoted as "Clk Generator (Clk Divider)") 330, for example comprising a clock divider arranged to receive a master clock signal 325 and to divide the master clock signal 325 to generate the clock signal 320 to the digital control module 310. The digital-to-RF converter module 300 illustrated in FIG. 3 further comprises a clock frequency decision module 340 which is arranged to determine a desired switching frequency value for the digital control word signal 120, and to provide the determined desired switching frequency value 345 to the clock generator component 330. The clock generator component 330 is further arranged to dynamically configure the frequency of the clock signal 320 output thereby in accordance with the received switching frequency value 345. In this manner, the clock generator component 330 is arranged to dynamically configure the digital control module 310 to output the digital control word signal 120 comprising a switching frequency in accordance with the desired digital control word switching frequency value 345.

In the illustrated example, the clock frequency decision module 340 is arranged to receive one or more parameters 350 corresponding to the RF signal to be modulated, and to determine a desired digital control word switching frequency value based at least partly on the received parameter(s) 350. For example, and as illustrated in the example of FIG. 3, the clock frequency decision module 340 may be arranged to retrieve a desired digital control word switching frequency value from one or more lookup table(s) (LUT(s)) 360 in accordance with the received parameter(s) 350. Alternatively, the clock frequency decision module 340 may be arranged to derive a desired digital control word switching frequency value by applying the received parameter(s) 350 to a digital control word switching frequency decision algorithm.

In examples of the invention, the parameters 350 based on which the clock frequency decision module 340 determines a desired digital control word switching frequency value may comprise any suitable parameters. For example, in addition to at least one parameter corresponding to a bandwidth of the RF signal to be modulated, such parameter(s) may comprise one or more of: at least one parameter corresponding to an RF channel frequency of the RF signal to be modulated; and/or at least one parameter corresponding to a power level of the RF signal to be modulated. In this manner, for a given RF channel frequency (e.g. 5210 MHz), signal bandwidth (e.g. 80 MHz) and power level (e.g. 12 dBm), a desired digital control word switching frequency may be determined in order to achieve a sufficiently high switching frequency to achieve appropriate modulation of the RF signal, whilst avoiding the introduction of DAC images at an application sensitive frequency band. For example, the desired digital control word switching frequency may be determined to be a frequency of 5210/3 MHz, which provides a switching frequency that avoids FCC restricted frequency bands.

Additionally and/or alternatively, the desired digital control word switching frequency may be determined in order to achieve a PSD (Power Spectral Density) curve that meets PSD requirements of a particular wireless communication standard, such as those developed by the 3rd Generation Partnership Project (3GPP) for wireless mobile communication.

Figure 4:
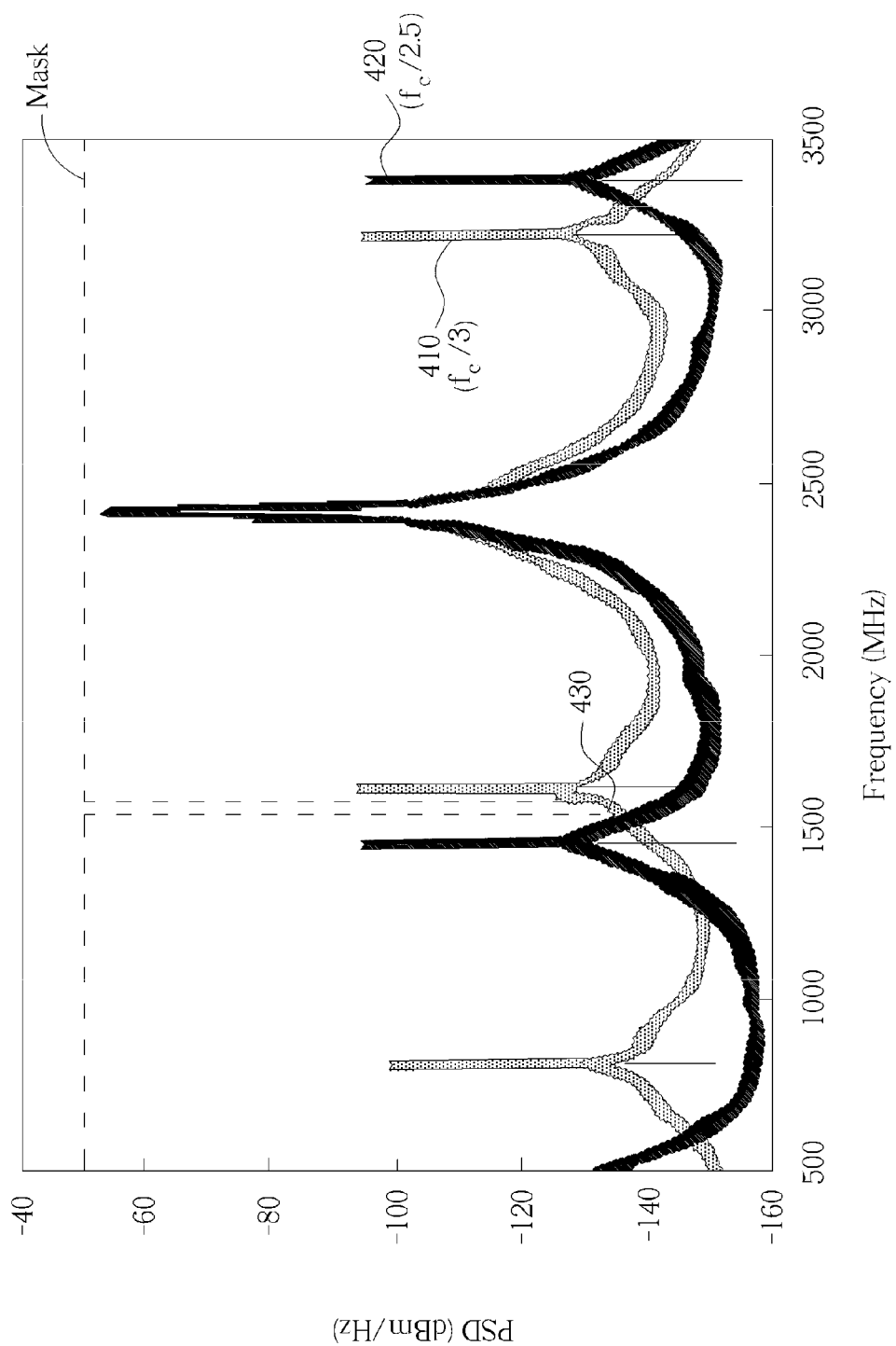
FIG. 4 illustrates a simplified graph showing examples of power spectral density (PSD) curves for RF modulated signals.

For example, FIG. 4 illustrates a simplified graph showing examples of PSD curves for RF modulated signals comprising DAC images in relation to PSD requirements for, in the illustrated example, the GPS (Global Positioning System) frequency band. In particular, the graph of FIG. 4 illustrates a first example PSD curve 410 that represents a PSD curve for a modulated RF signal 130 modulated in response to a digital control word signal 120 comprising a switching frequency of $f_c/3$, $f_c$ being a carrier frequency of the modulated RF signal 130. In the illustrated example, the DAC images in this modulated RF signal 130, represented by the spikes within the PSD curve 410, do not meet the requirements for the GPS frequency band since PSD curve 410 is above a desired mask level at the corresponding GPS frequency location 430. The graph of FIG. 4 further comprises a second example PSD curve 420 which represents a PSD curve for a modulated RF signal 130 modulated in response to a digital control word signal 120 comprising a switching frequency of $f_c/2.5$. Unlike the first example PSD curve 410, the DAC images in this modulated RF signal 130 do meet the requirements for the GPS frequency band. Thus, by dynamically configuring the switching frequency of the digital control word signal 210, the PSD curve of the modulated signal 130 may be manipulated to meet PSD requirements.

The digital-to-RF converter module 300 illustrated in FIG. 3 enables the manipulation of DAC images introduced into the modulated RF signal 130 by virtue of the use of digital code-word signals 120 to control analogue blocks within the digital-to-RF converter component 100. In particular, by dynamically configuring digital control word signal 120 to comprise a particular digital control word switching frequency, the DAC images may be manipulated to reduce the presence of such DAC images within application sensitive frequency bands, and/or to cause such DAC images to be induced outside of such application sensitive frequency bands.

Advantageously, by enabling the manipulation of DAC images in this manner to enable regulatory and in-device requirements to be met, the need for such DAC images to subsequently be suppressed, for example by way of additional analogue band-pass filtering, may be substantially alleviated, providing an efficient, low cost solution that is suitable for wide-bandwidth applications.

Figure 5:
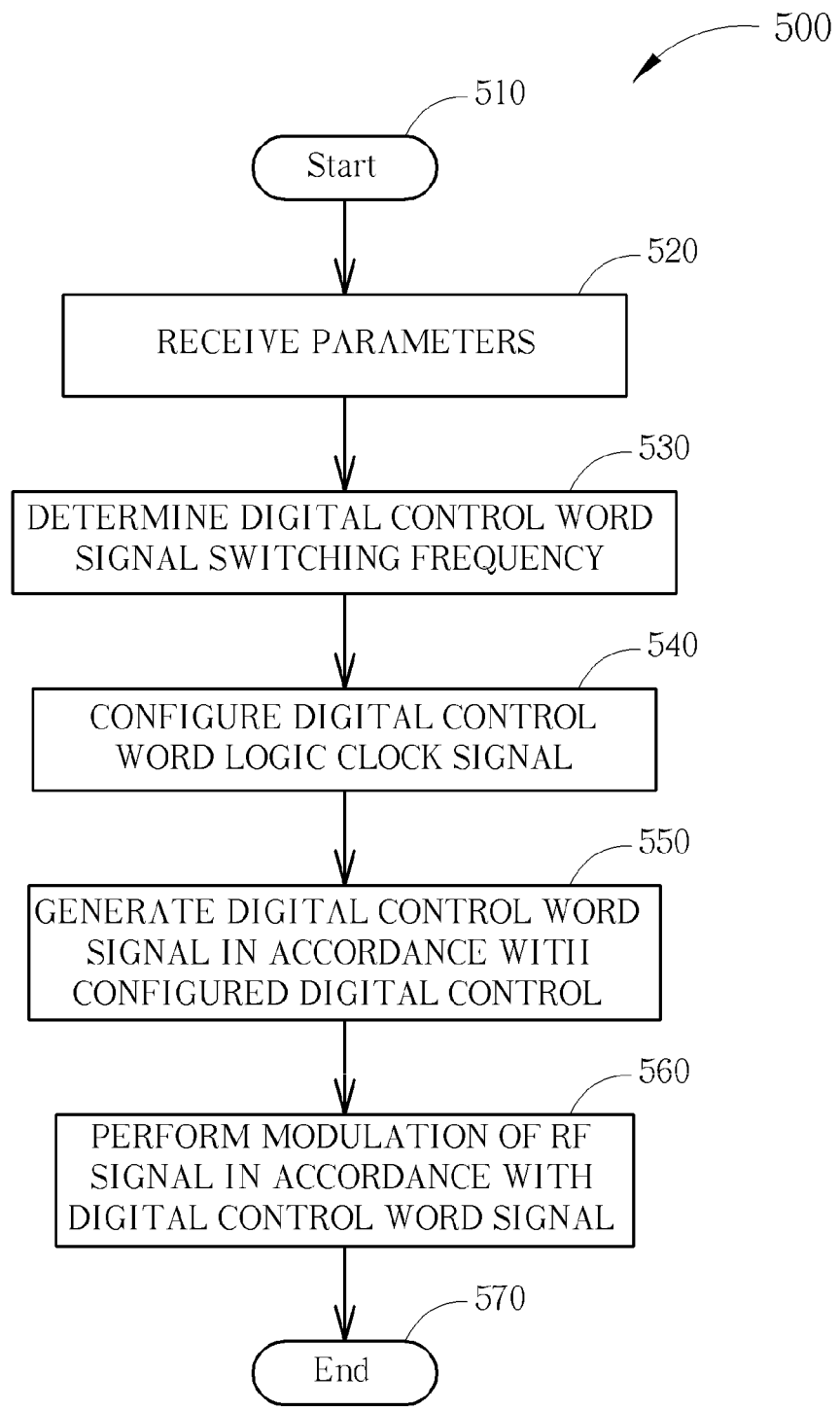
FIG. 5 illustrates a simplified flowchart of an example of a method of performing modulation of an RF signal within a digital-to RF-converter.

Referring now to FIG. 5, there is illustrated a simplified flowchart 500 of a method of performing modulation of an RF signal within a digital-to-RF converter, such as may be implemented within the digital-to-RF converter module 300 of FIG. 3. The method starts at step 510, and moves on to step 520 with the receipt of one or more parameters corresponding to the RF signal to be modulated. Next, at step 530, a desired digital control word switching frequency value is determined. Next, at step 540, a clock signal provided to the digital control word logic that outputs the digital control word signal is configured in accordance with the desired digital control word switching frequency, and the digital control word signal is then generated in accordance with the configured digital control word logic clock signal at step 550. Modulation of the RF signal is then performed, at step 560, in accordance with the generated digital control word signal. The method then ends, at step 570.

As previously mentioned, a digital-to-RF converter module 300 adapted in accordance with examples of the present invention may be implemented within a digital-to-RF transmitter, with an example of such a digital-to-RF transmitter being illustrated in FIG. 2. In the example illustrated in FIG. 2, the digital-to-RF transmitter 200 comprises a complex (in-phase/quadrature) transmitter. However, it will be appreciated that the present invention may equally be implemented within alternative forms of digital-to-RF transmitter architectures.

Figure 6:
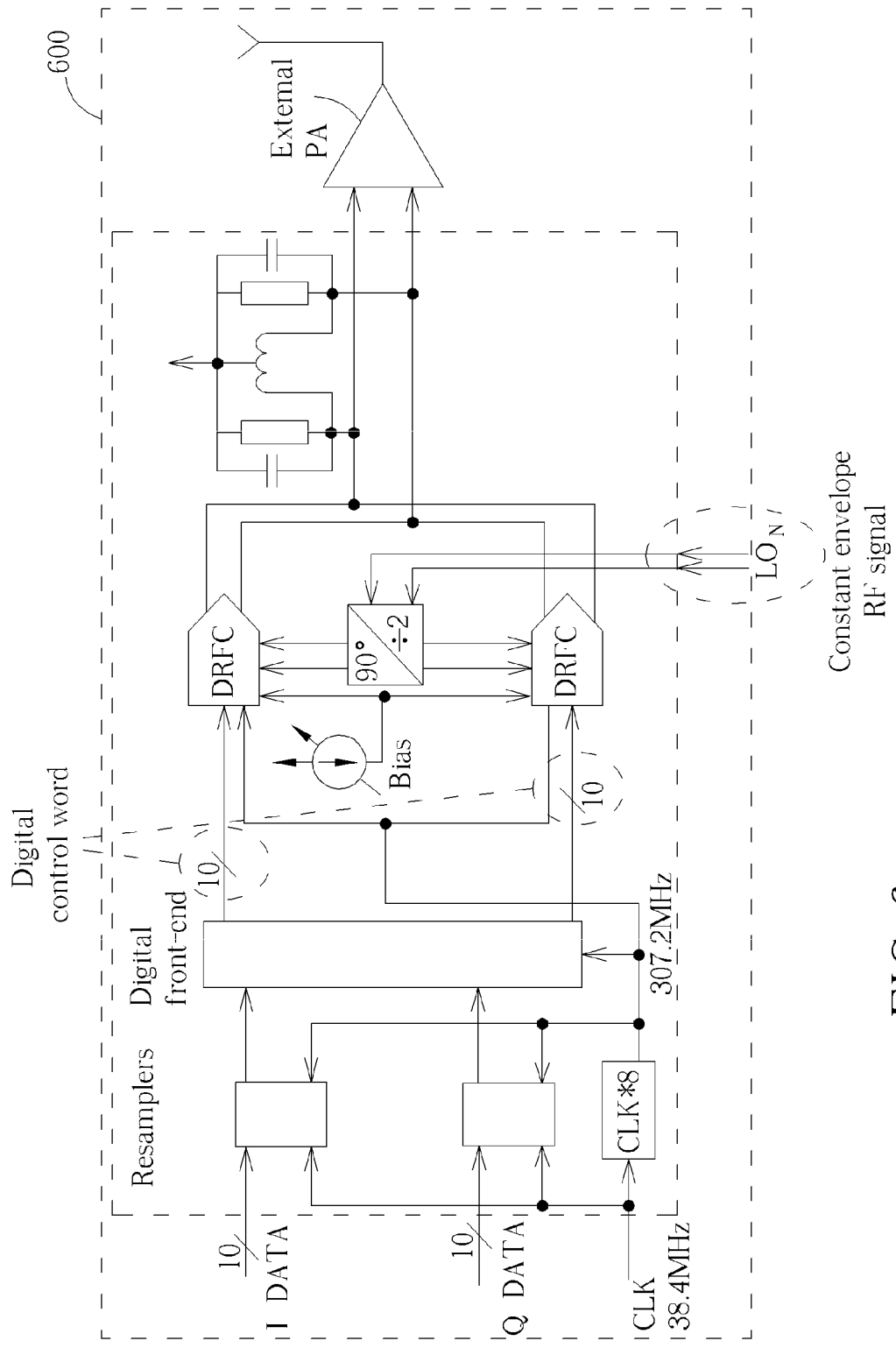
FIGS. 6 to 8 illustrate simplified block diagrams of alternative examples of digital-to-RF transmitter architectures.

For example, it is contemplated that examples of the present invention may be implemented within alternative implementations of complex (in-phase/quadrature) transmitter architectures, such as the complex (in-phase/quadrature) RF DAC transmitter architecture 600 illustrated in FIG. 6.

Figure 7:
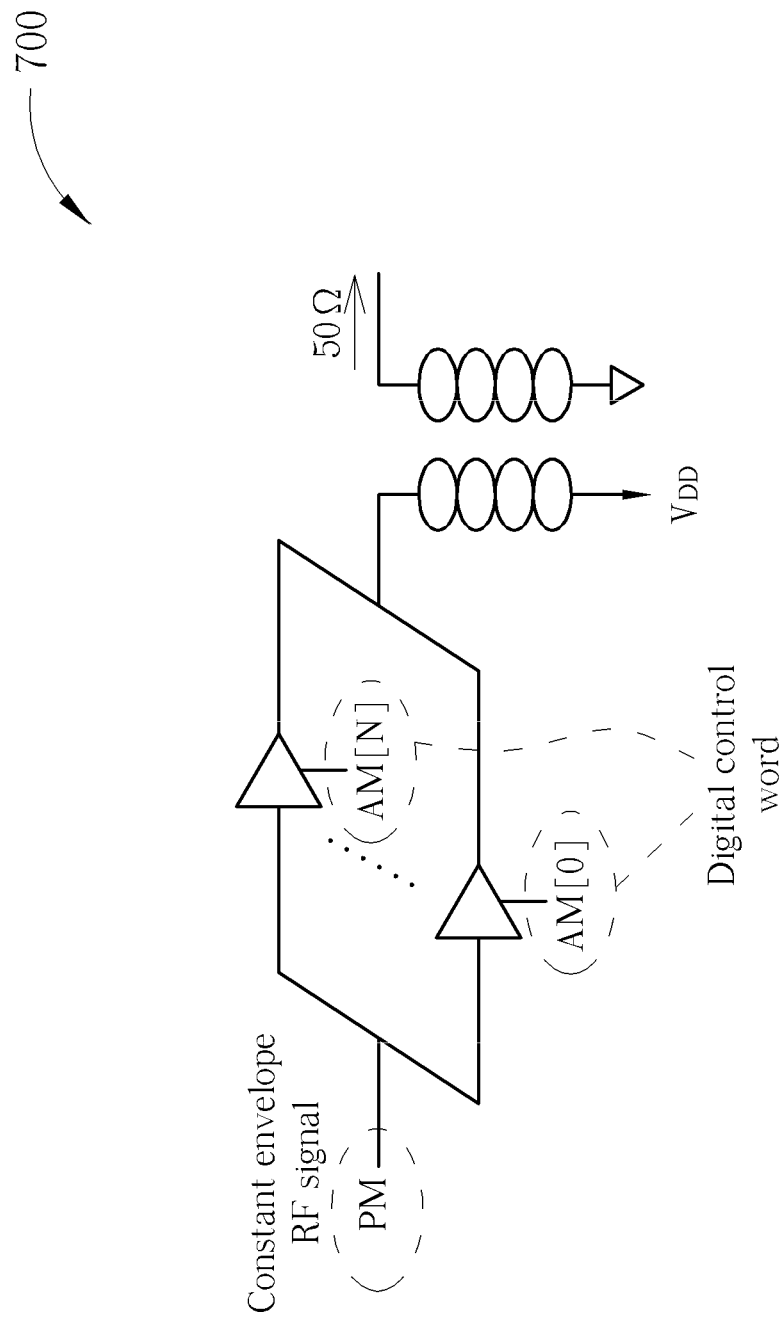
Figure 8:
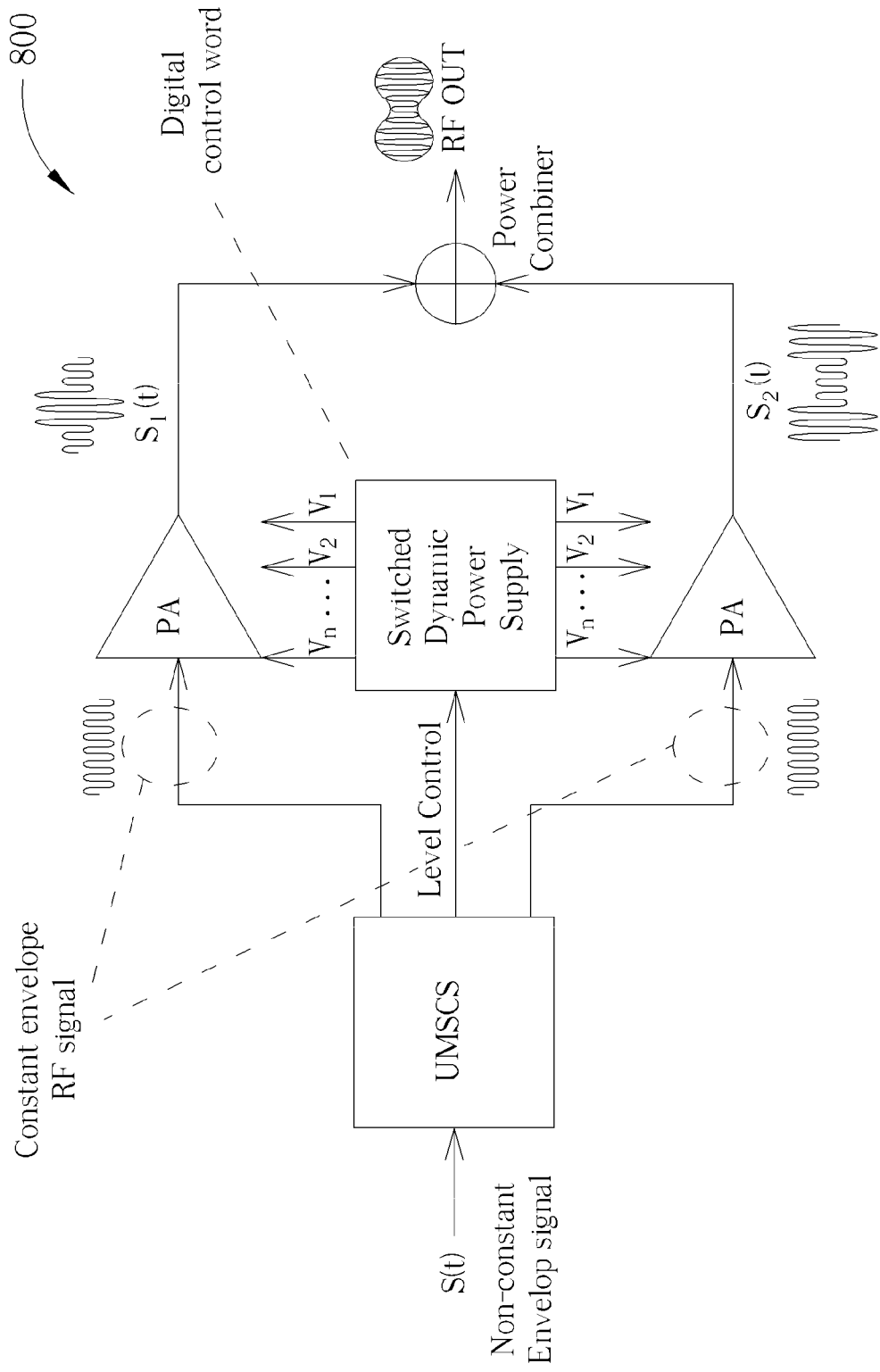

Alternatively, it is contemplated that examples of the present invention may be implemented within digital polar, or hybrid polar transmitter architectures, such as the transmitter architecture 700 illustrated in FIG. 7. Additionally, it is contemplated that examples of the present invention may be implemented within LINC (Linear amplification using Nonlinear Components) transmitter architecture, such as the LINC transmitter architecture 800 illustrated in FIG. 8.

Although examples of the invention have been described with reference to implementation in various digital-to-RF transmitter architectures, it is contemplated that the concepts described herein are equally applicable to other architectures.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, the various components/modules, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps than those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

What is claimed is:

1. A method of performing modulation of a radio frequency (RF) signal within a digital-to-RF converter, the method comprising:
   determining a desired digital control word switching frequency value based at least partly on at least one parameter corresponding to a bandwidth of the RF signal to be modulated and at least one from a group comprising:
      at least one parameter corresponding to an RF channel frequency of the RF signal to be modulated; and
      at least one parameter corresponding to a power level of the RF signal to be modulated;
   dynamically configuring at least one digital control module to output at least one digital control word signal in accordance with the desired digital control word switching frequency value; and
   performing modulation of the RF signal in accordance with the at least one digital control word signal output by the at least one digital control module.

2. The method of claim 1, wherein the method comprises dynamically configuring a clock signal for the at least one digital control module based at least partly on the desired digital control word switching frequency value.

3. The method of claim 1, wherein the determining a desired digital control word switching frequency value is performed based on at least one parameter corresponding to each of a bandwidth of the RF signal to be modulated, an RF channel frequency of the RF signal to be modulated; and a power level of the RF signal to be modulated.

4. The method of claim 3, wherein the method further comprises retrieving a desired digital control word switching frequency value from at least one lookup table in accordance with the received at least one parameter.

5. The method of claim 3, wherein the method further comprises deriving a desired digital control word switching frequency value by applying the received at least on parameter to a digital control word switching frequency decision algorithm.

6. The method of claim 3, wherein the determining a desired digital control word switching frequency value is performed based on at least two substantially simultaneous parameters corresponding to a bandwidth of the RF signal to be modulated, an RF channel frequency of the RF signal to be modulated; and a power level of the RF signal to be modulated.

7. The method of claim 3, wherein the method further comprises performing modulation of the RF signal within a digital-to-RF converter within one of:
   a complex digital-to-RF transmitter;
   a digital polar transmitter;
   a hybrid polar transmitter; and
   a LINC transmitter.

8. The method of claim 3, wherein the method comprises determining a desired digital control word switching frequency value to reduce digital to analogue conversion images within application sensitive frequency bands.

9. The method of claim 3, wherein the method comprises determining a desired digital control word switching frequency value to induce digital to analogue conversion images outside of application sensitive frequency bands.

10. A digital-to-RF converter module for performing modulation of a radio frequency (RF) signal, the digital-to-RF module being arranged to:
   determine a desired digital control word switching frequency value based at least partly on at least one parameter corresponding to a bandwidth of the RF signal to be modulated and at least one from a group comprising:
      at least one parameter corresponding to an RF channel frequency of the RF signal to be modulated; and
      at least one parameter corresponding to a power level of the RF signal to be modulated;
   configure dynamically at least one digital control module to output at least one digital control word signal in accordance with the desired digital control word switching frequency value; and
   perform modulation of the RF signal in accordance with the at least one digital control word signal output by the at least one digital control module.

11. The digital-to-RF converter module of claim 10 implemented within an integrated circuit device comprising at least one die within a single integrated circuit package.

12. A radio frequency (RF) transmitter comprising a digital-to-RF converter module arranged to:
   determine a desired digital control word switching frequency value based at least partly on at least one parameter corresponding to a bandwidth of the RF signal to be modulated and at least one from a group comprising:
      at least one parameter corresponding to an RF channel frequency of the RF signal to be modulated; and
      at least one parameter corresponding to a power level of the RF signal to be modulated;
   configure dynamically at least one digital control module to output at least one digital control word signal in accordance with the desired digital control word switching frequency value; and
   perform modulation of the RF signal in accordance with the at least one digital control word signal output by the at least one digital control module.

13. The RF transmitter of claim 12 wherein the digital-to-RF converter module is arranged to dynamically configure a clock signal for the at least one digital control module based at least partly on the desired digital control word switching frequency value.

14. The RF transmitter of claim 12, wherein the digital-to-RF converter module is further arranged to receive at least one parameter corresponding to the RF signal to be modulated and determining a desired digital control word switching frequency value based at least partly on the received at least one parameter.

15. The RF transmitter of claim 14, wherein the digital-to-RF converter module is further arranged to retrieve a desired digital control word switching frequency value from at least one lookup table in accordance with the received at least one parameter.

16. The RF transmitter of claim 14, wherein the digital-to-RF converter module is further arranged to derive a desired digital control word switching frequency value by applying the received at least on parameter to a digital control word switching frequency decision algorithm.

17. The RF transmitter of claim 14, wherein the digital-to-RF converter module is further arranged to determine a desired digital control word switching frequency value based at least partly on at least one parameter from a group of parameters comprising:

at least one parameter corresponding to an RF channel frequency of the RF signal to be modulated;

at least one parameter corresponding to a bandwidth of the RF signal to be modulated; and at least one parameter corresponding to a power level of the RF signal to be modulated.

18. The RF transmitter of claim 14, wherein the digital-to-RF converter module is further arranged to modulate the RF signal within one of:

a complex digital-to-RF transmitter;
a digital polar transmitter;
a hybrid polar transmitter; and
a LINC transmitter.

19. The RF transmitter of claim 14, wherein the digital-to-RF converter module is arranged to determine a desired digital control word switching frequency value to reduce digital to analogue conversion images within application sensitive frequency bands.

20. The RF transmitter of claim 14, wherein the digital-to-RF converter module is arranged to determine a desired digital control word switching frequency value to induce digital to analogue conversion images outside of application sensitive frequency bands.

* * * * *